United States Patent [19]

Wanlass

[11] Patent Number: 5,019,177
[45] Date of Patent: May 28, 1991

[54] MONOLITHIC TANDEM SOLAR CELL

[75] Inventor: Mark W. Wanlass, Golden, Colo.

[73] Assignee: The United States of America as represented by the United States Department of Energy, Washington, D.C.

[21] Appl. No.: 431,364

[22] Filed: Nov. 3, 1989

[51] Int. Cl.⁵ .................. H01L 31/068; H01L 31/18
[52] U.S. Cl. ........................................ 136/249; 437/5
[58] Field of Search ...................... 136/249 TJ; 437/5

[56] References Cited

U.S. PATENT DOCUMENTS

| | | | |
|---|---|---|---|
| 4,289,920 | 9/1981 | Hovel | 136/246 |
| 4,667,059 | 5/1987 | Olson | 136/249 |
| 4,775,425 | 10/1988 | Guha et al. | 136/249 |
| 4,795,501 | 1/1989 | Stanbery | 136/249 |
| 4,816,420 | 3/1989 | Bozler | 437/2 |
| 4,963,949 | 10/1990 | Wanlass et al. | 357/16 |

FOREIGN PATENT DOCUMENTS

| | | | |
|---|---|---|---|
| 56-138959 | 10/1981 | Japan | 136/249 TJ |
| 59-124773 | 7/1984 | Japan | 136/249 JT |

OTHER PUBLICATIONS

N. Ito et al, *Jap. J. Appl. Phys.*, vol. 20 (1981), Supplement 20-2, pp. 121-125.
S. Sakai et al., *J. Appl. Phys.*, vol. 51, pp. 5018-5024 (1980).
R. A. LaRue et al, *Conference Record, 16th IEEE Photovoltaic Specialists Conf.* (1982), pp. 228-230.
B. Beaumont et al, *Solar Cells*, vol. 26, pp. 313-321 (1989).
Yamaguchi et al. *Minority-carrier Injection Annealing of Electron Irradiation-induced Defects in InP Solar Cells*, Appl. Phys. Lett., 44, p. 432 (1984).

*Primary Examiner*—Aaron Weisstuch
*Attorney, Agent, or Firm*—Kenneth Richardson; James W. Weinberger; William R. Moser

[57] ABSTRACT

A single-crystal, monolithic, tandem, photovoltaic solar cell is described which includes (a) an InP substrate having upper and lower surfaces, (b) a first photoactive subcell on the upper surface of the InP substrate, and (c) a second photoactive subcell on the first subcell. The first photoactive subcell is GaInAsP of defined composition. The second subcell is InP. The two subcells are lattice matched. The solar cell can be provided as a two-terminal device or a three-terminal device.

12 Claims, 5 Drawing Sheets

MONOLITHIC TANDEM SOLAR CELL

CONTRACTUAL ORIGIN OF THE INVENTION

The United States Government has rights in this invention under Contract No. DE-AC02-83CH10093 between the United States Department of Energy and the Solar Energy Research Institute, a Division of the Midwest Research Institute.

BACKGROUND OF THE INVENTION

1. Field of the Invention

The present invention relates, generally, to photovoltaic solar cells and, more particularly, to multijunction tandem photovoltaic solar cells. Specifically, the present invention relates to improved monolithic tandem photovoltaic solar cells which are efficient, radiation-resistant, and useful in space applications in addition to terrestrial applications.

2. Description of the Prior Art

Photovoltaic cells, commonly known as solar cells, essentially comprise semiconductors that have the capability of converting electromagnetic energy (such as light or solar radiation) directly to electricity. Such semiconductors are usually characterized by solid crystalline structures that have energy bandgaps between their valence electron bands and their conduction electron bands. When light is absorbed by the material, electrons that occupy low-energy states become excited to cross the bandgap to higher energy states. For example, when electrons in the valence band of a semiconductor absorb sufficient energy from photons of the solar radiation, they can jump the bandgap to the higher energy conduction band.

Electrons which are excited to higher energy states leave behind unoccupied low-energy positions or holes. Such holes can shift from atom to atom in the crystal lattice and thereby act as charge carriers, as do free electrons in the conduction band, and contribute to the crystal's conductivity. Most of the photons absorbed in the semiconductor give rise to such electron-hole pairs which generate the photocurrent and, in turn, the photovoltage exhibited by the solar cell.

As is known, the semiconductor is doped with a dissimilar material to produce a space charge layer which separates the holes and electrons for use as charge carriers. Once separated, these collected hole and electron charge carriers produce a space charge that results in a voltage across the junction, which is the photovoltage. If these hole and charge carriers are allowed to flow through an external load, they constitute a photocurrent.

It is known that photon energies in excess of the threshold energy gap or bandgap between the valence and conduction bands are usually dissipated as heat; thus they are wasted and do no useful work. More specifically, there is a fixed quantum of potential energy difference across the bandgap in the semiconductor. For an electron in the lower energy valence band to be excited to jump the bandgap to the higher energy conduction band, it has to absorb a sufficient quantum of energy, usually from an absorbed photon, with a value at least equal to the potential energy difference across the bandgap.

The semiconductor is transparent to radiation, with photon energies less than the bandgap. On the other hand, if the electron absorbs more than the threshold quantum of energy, e.g., from a higher energy photon, it can jump the bandgap. The excess of such absorbed energy over the threshold quantum required for the electron to jump the bandgap results in an electron that is higher in energy than most of the other electrons in the conduction band. The excess energy is eventually lost in the form of heat. The net result is that the effective photovoltage of a single bandgap semiconductor is limited by the bandgap.

Thus, in a single semiconductor solar cell, to capture as many photons as possible from the spectrum of solar radiation, the semiconductor must have a small bandgap so that even photons having lower energies can excite electrons to jump the bandgap. This, of course, involves attendant limitations. First, use of a small bandgap material results in a low photovoltage for the device and, naturally, lower power output occurs. Second, the photons from higher energy radiation produce excess energy which is lost as heat.

On the other hand, if the semiconductor is designed with a larger bandgap to increase the photovoltage and reduce energy loss caused by thermalization of hot carriers, then the photons with lower energies will not be absorbed. Consequently, in designing conventional single-junction solar cells, it is necessary to balance these considerations and try to design a semiconductor with an optimum bandgap, realizing that in the balance there has to be a significant loss of energy from both large and small energy photons.

Much work has been done in recent years to solve this problem by fabricating tandem or multijunction (cascade) solar cell structures in which a top cell has a larger bandgap and absorbs the higher energy photons, while the lower energy photons pass through the top cell into lower or bottom cells that have smaller bandgaps to absorb lower energy radiation.

The bandgaps are ordered from highest to lowest, top to bottom, to achieve an optical cascading effect. In principle, an arbitrary number of subcells can be stacked in such a manner; however, the practical limit is usually considered to be two or three. Multijunction solar cells are capable of achieving higher conversion efficiencies since each subcell converts solar energy to electrical energy over a small photon wavelength band, over which it converts energy efficiently.

Various electrical connectivity options between subcells are possible, including: (1) series connected, (2) voltage matched, and (3) independently connected. In the series connected type of tandem solar cells, there is current matching of the two subcells. The advantage of the independently connected type is that it avoids the problems of having to electrically connect the two subcells. This type also allows more possibilities in designing the solar cell. However, it is more complex with respect to fabrication of the solar cell, and it is also more complex in terms of delivering the power from each separate cell to a single electrical load. This is a systems problem.

Such tandem cells can be fabricated in two different manners. The first manner involves separately manufacturing each solar cell (with different bandgaps) and then stacking the cells mechanically in optical series by any of a number of known methods. The disadvantage of this method is due to the complexity in forming such a stacked arrangement. The advantage is the flexibility of being able to stack different materials on top of each other.

The second manner of fabricating a tandem solar cell involves forming a monolithic crystalline stack of materials with the desired bandgaps. The advantage of this method is the simplicity in processing. The disadvantage is that there are a limited number of materials combinations which can be epitaxially grown in device-quality form.

It has been generally accepted by persons skilled in the art that the desired configuration for monolithic multijunction tandem devices is best achieved by lattice matching the top cell material to the bottom cell material. Mismatches in the lattice constants create defects or dislocations in the crystal lattice where recombination centers can occur to cause the loss of photogenerated minority carriers, thus significantly degrading the photovoltaic quality of the device. More specifically, such effects will decrease the open-circuit voltage ($V_{oc}$), short circuit current ($J_{sc}$), and fill factor (FF), which represents the relationship or balance between current and voltage for effective power output. Thus, the lattice-matched monolithic approach provides an elegant manner for the construction of a high-quality tandem cell.

One common problem with conventional semiconductors is their lack of radiation resistance, as would be required to ensure degradation-free operation in space. This problem is especially troublesome when considering space photovoltaics, where conventional Si solar cells degrade with time. Thus, alternate semiconductor materials have been investigated to overcome these problems.

Indium phosphide (InP) is an attractive III-V semiconductor for a variety of electronic device applications involving heterostructures because of the large number of lattice-matched III-V ternary and quaternary materials available, for example, GaAsSb, GaInAs, AlAsSb, GaInAsP, and AlInAs. In addition to being lattice matched, these compounds offer a wide range of bandgaps which aid in the design of complex device structures. InP is also considered a prime candidate for space photovoltaic applications because of its superior radiation hardness and demonstrated high efficiencies.

Thus, the possibility of constructing radiation-hard InP-based tandem solar cells for space application appears feasible. However, none has been disclosed in the art to date.

Other techniques for making a tandem solar cell are known. For example, U.S. Pat. 4,289,920 describes a two-cell cell construction in which different semiconductor materials are grown on opposite surfaces of a transparent insulating substrate. In other words, the two semiconductors are not in physical contact with each other. Consequently, there is no need to lattice match the two semiconductors; however, the problems associated with forming high-quality semiconductor layers on the intermediate substrate are undoubtedly substantial. A metal layer covering the bottom surface of the lower semiconductor reflects light through the structure. The metal layer wraps around the edge to connect the two cells in electrical series.

There has not heretofore been provided a monolithic tandem photovoltaic solar cell having the advantages and desirable combination of features which are exhibited by the devices of the present invention.

SUMMARY OF THE INVENTION

It is an object of the invention to provide a monolithic tandem photovoltaic solar cell which is highly radiation resistant and efficient.

It is another object of the invention to provide a monolithic tandem photovoltaic solar cell in which the energy bandgap of the lower subcell can be tailored for specific applications.

It is yet another object of the invention to provide a monolithic tandem photovoltaic solar cell comprising layers of InP and GaInAsP (or GaInAs), where said photovoltaic cell is useful, for example, in space power applications.

It is yet another object of the invention to provide a tandem photovoltaic solar cell having an improved power-to-mass ratio.

It is yet another object of the invention to provide a monolithic tandem photovoltaic solar cell in which subcells are lattice-matched.

It is still another object of this invention to provide two-terminal and three-terminal monolithic tandem photovoltaic solar cells.

Additional objects, advantages and novel features of the invention shall be set forth in part in the description that follows, and in part will become apparent to those skilled in the art upon examination of the following or may be learned by the practice of the invention. The objects and the advantages of the invention may be realized and attained by means of the instrumentalities and in combinations particularly pointed out in the appended claims.

To achieve the foregoing and other objects and in accordance with the purpose of the present invention, as embodied and broadly described herein, the monolithic tandem photovoltaic solar cell may comprise;
(a) an InP substrate having an upper surface;
(b) a first photoactive subcell on the upper surface of the InP substrate; wherein the first subcell comprises GaInAs (which could include GaInAsP) and includes a homojunction; and
(c) a second photoactive subcell on the first subcell; wherein the second subcell comprises InP and includes a homojunction.

The GaInAs (which could include GaInAsP) subcell is lattice-matched with the InP. The InP subcell has a larger energy bandgap than the first subcell.

The photovoltaic solar cell of the invention exhibits several advantages. It is a monolithic lattice-matched device structure which, in principle, can be made with as few as four distinct epitaxial layers. The bandgap of the lower subcell can be tuned or designed without compromising lattice matching.

Computer modeling of the performance of the solar cell of the invention shows that the solar cell is capable of very high efficiencies under AM0 or terrestrial illumination conditions (particularly under concentrated solar illumination).

The technology for fabricating and handling InP and GaInAsP materials is well developed from applications in other electronic and optoelectronic devices, thus facilitating device processing.

For space applications the tandem solar cell is particularly advantageous because it uses a radiation-hard top cell which produces 75 to 80% of the total power output of the tandem solar cell.

Further, the solar cell construction of this invention allows for two- or three-terminal device configuration, which in turn results in significant flexibility as far as extracting power from each of the subcells is concerned.

BRIEF DESCRIPTION OF THE DRAWINGS

The accompanying drawings, which are incorporated in and form a part of the specification, illustrate the preferred embodiments of the present invention and, with the description, explain the principles of the invention. In the drawings.

DETAILED DESCRIPTION OF THE PREFERRED EMBODIMENTS

Figure 1:
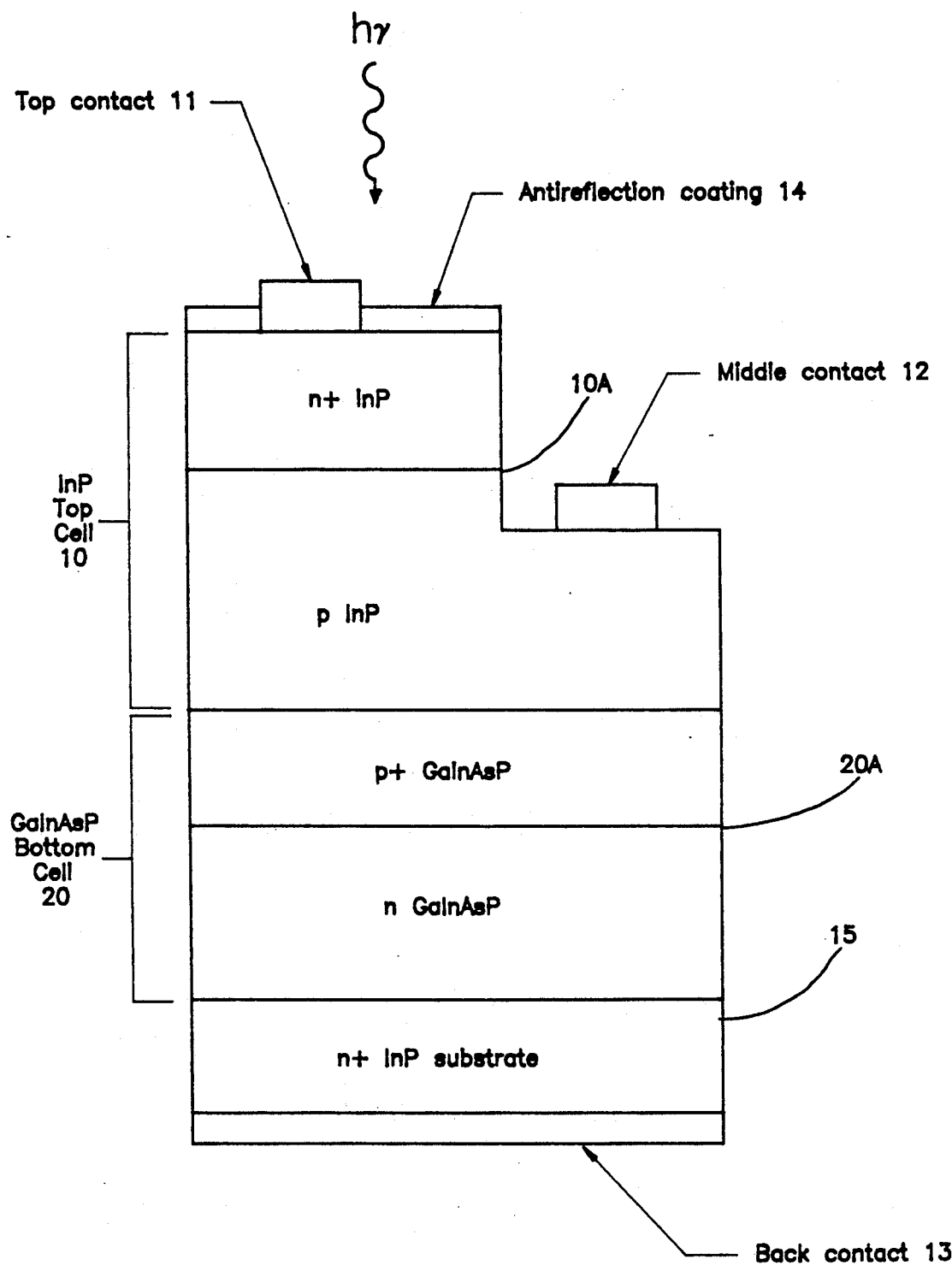
FIG. 1 is a side elevational view in schematic of one embodiment of monolithic tandem photovoltaic solar cell of the invention.

FIG. 1 illustrates one preferred embodiment of the invention, which is a single-crystal, monolithic, two-junction, three-terminal tandem solar cell. This cell includes an InP upper subcell 10 which includes a homojunction 10A. The solar cell also includes a GaInAs or GaInAsP bottom subcell 20 which includes a homojunction 20A. Under the bottom subcell there is an InP substrate 15.

Top conductive contact 11 is supported by the upper surface of the upper subcell 10, as illustrated, and is low-resistance and ohmic electrically. Back conductive contact 13 is in contact with the lower surface of the InP substrate and is low-resistance and ohmic electrically. Middle contact 12 is supported by the p-layer of the upper cell 10 and is low-resistance and ohmic electrically. Contacts 11 and 13 may be gold, for example. Contact 12 may be a laminate of gold and zinc, for example.

Each subcell includes photoactive regions. For example, the photoactive regions of subcell 10 include the n+-InP upper region and a portion of the p-InP lower region directly below the n+/p junction. The photoactive region of subcell 20 includes both p+- and n-type regions thereof. The lower region of subcell 10 and the upper region of subcell 20 are of common conductivity type. Thus, as illustrated in FIG. 1, the lower region of subcell 10 and the upper region of subcell 20 are both p-type. Of course, if desired, both of said regions could instead be n-type. (i.e., for p/n/p devices). The ohmic middle contact 12 is placed between the photoactive regions of both subcells.

On the top surface of the upper subcell 10 there is a conventional antireflection coating 14. The purpose of this coating is to prevent radiation from being reflected off the upper surface of the subcell 10.

The substrate 15 is illustrated in the drawings as an InP substrate. InP is an attractive III-V semiconductor for a variety of electronic device applications because of its electronic and optoelectronic properties. Among the main disadvantages associated with the use of the material as a substrate, however, are the high cost, fragility and high mass density of InP.

Substrate 15 may be composed essentially of InP, or it may be a thin layer of InP on another semiconductor material, or it may be any of the alternative substrate structures as defined in commonly assigned copending application Ser. No. 251,484, filed Sept. 3, 1988, now U.S. Pat. No. 4,963,949, incorporated herein by reference. Said application describes techniques for growing device quality InP on foreign substrates while minimizing the propagation of dislocations into the InP layer. Such techniques enable a low-cost, lightweight substrate structure having good strength to be used for an InP-based semiconductor device. Accordingly, such techniques can be used in the preparation of substrates structures which are useful in the present invention.

The bottom or lower subcell 20 is grown on the upper surface of InP substrate 15 epitaxially so that the material of the subcell 20 is lattice-matched to the InP. The upper or top subcell 10 is grown on the upper surface of the lower subcell epitaxially so that the InP top subcell is lattice-matched to the lower subcell. Thus, a single-crystal monolithic tandem photovoltaic solar cell is obtained.

The composition of the lower subcell 20 is represented by the formula $Ga_xIn_{1-x}As_yP_{1-y}$ where x is in the range of 0.200 to 0.467, and y is in the range of 0.436 to 1.000.

The necessary relationship between x and y is defined by the formula $y=2.209x/(1+0.06864x)$. Thus, at one endpoint, where y equals 1, there is no phosphorus in the composition. As long as the composition is defined by the relationship of x and y described above, the lower subcell material will be lattice-matched with the InP substrate and also the InP top subcell. References herein to GaInAs or GaInAsP are generic references to the composition of the lower subcell as defined above. Hereafter it is referred to as GaInAsP.

The GaInAsP layer may be grown or deposited on the InP substrate, and the InP upper subcell is deposited on the upper surface of the GaInAsP subcell, by an epitaxial crystal growth technique such as atmospheric-pressure metallorganic vapor phase epitaxy. This technique is known in the art.

The upper subcell has a larger energy bandgap than the lower subcell. The energy bandgap for the upper subcell is 1.35 eV at 300K. The energy bandgap of the lower subcell may be varied by changing the composition of the elements in the GaInAsP subcell.

The optimum bottom or lower subcell bandgap will range from 0.75 to 1.0 eV, depending upon the operating conditions (i.e., temperature, solar concentration ratio, and incident spectrum) and the subcell connectivity. This bandgap range is obtained within the broad composition range for the GaInAsP lower subcell as defined above.

Although the solar cell of the invention is illustrated in FIG. 1 as comprising an upper subcell of the n/p type and a lower subcell of the p/n type, the opposite configuration is considered to be a functional equivalent thereof.

The thickness of the lower subcell may vary but generally it will be in the range of about 3 to 6 microns. The thickness of the upper subcell may also vary but generally it will be in the range of about 0.5 to 5 microns. The thickness of the substrate 15 is preferably in the range of about 300 to 600 microns.

The tandem solar cell illustrated in FIG. 1 is a three-terminal device. Either voltage matched operation or independent operation is possible using this configuration.

The upper subcell exhibits good radiation resistance. Therefore, the tandem solar cell can be used in space applications. It also exhibits high conversion efficiency and a high power-to-mass ratio. This is due to the fact that the lower bandgap bottom subcell is sensitive to infrared radiation which is highly abundant in the AM0 spectrum. Of course, this solar cell is also useful in terrestrial applications, as is illustrated in more detail below.

For n-type doping, it is known to use conventional extrinsic impurities such as, for example, sulfur, tellurium, or selenium. For p-type doping, it is known to use elements such as zinc, cadmium, beryllium, or magnesium.

The following Table I illustrates the modeled efficiency of the tandem solar cell of FIG. 1 when the lower subcell has the composition $Ga_{0.47}In_{0.53}As$. The data shown are for theoretical operation of the solar cell at AM0 (i.e., in space).

TABLE I

| Temperature (°C.) | Solar Concentration Ratio | InP Top Cell Efficiency (%) | $Ga_{0.47}In_{0.53}As$ Bottom Cell Efficiency (%) | Tandem Cell Efficiency (%) |
|---|---|---|---|---|
| 25 | 1 | 25.9 | 7.1 | 33.0 |
|  | 10 | 27.8 | 8.5 | 36.3 |
|  | 100 | 29.6 | 9.9 | 39.5 |
|  | 1000 | 31.4 | 11.3 | 42.7 |
| 80 | 1 | 22.5 | 4.5 | 26.9 |
|  | 10 | 24.7 | 6.1 | 30.8 |
|  | 100 | 26.9 | 7.8 | 34.7 |
|  | 1000 | 29.1 | 9.4 | 38.5 |

The following Table II illustrates the modeled efficiency of the same tandem solar cell for theoretical operation thereof under terrestrial illumination.

TABLE II

| Temperature (°C.) | Solar Concentration Ratio | InP Top Cell Efficiency (%) | $Ga_{0.47}In_{0.53}As$ Bottom Cell Efficiency (%) | Tandem Cell Efficiency (%) |
|---|---|---|---|---|
| 25 | 1 | 28.7 | 6.4 | 35.1 |
|  | 10 | 30.7 | 7.7 | 38.4 |
|  | 100 | 32.8 | 9.0 | 41.8 |
|  | 1000 | 34.8 | 10.3 | 45.1 |
| 80 | 1 | 24.8 | 4.0 | 28.8 |
|  | 10 | 27.2 | 5.6 | 32.8 |
|  | 100 | 29.6 | 7.1 | 36.7 |
|  | 1000 | 32.1 | 8.7 | 40.8 |

Figure 4:
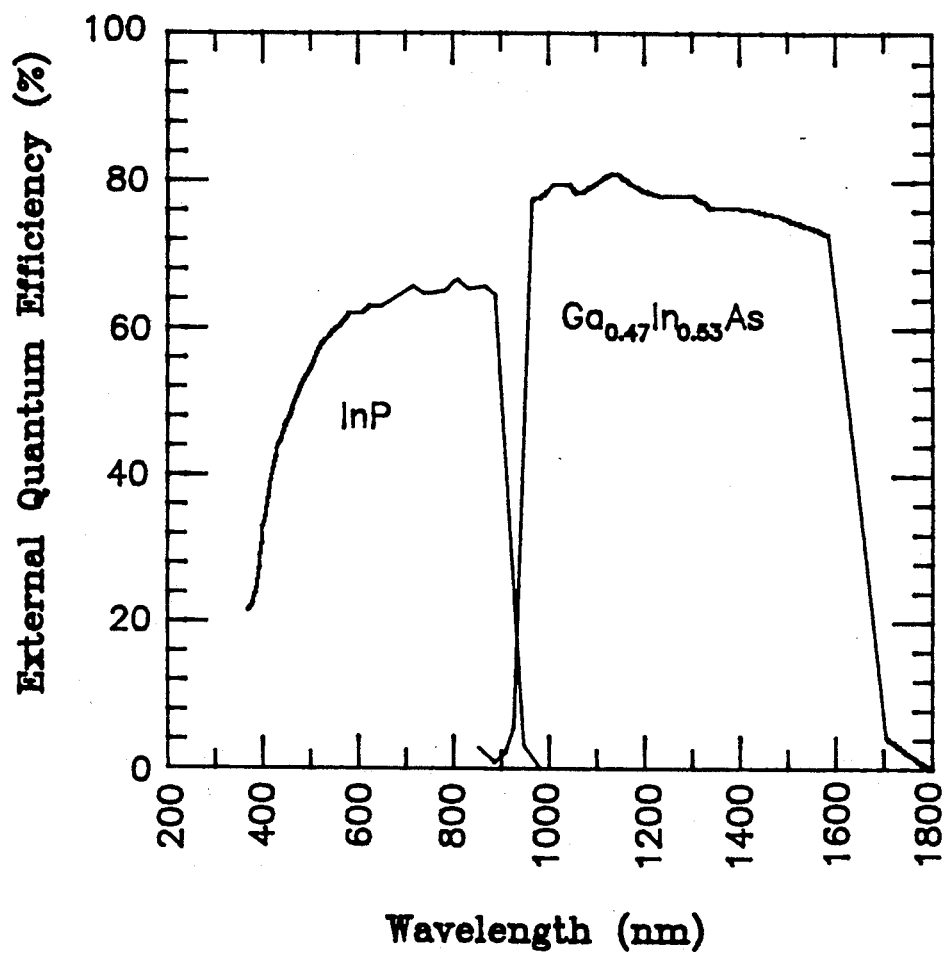
FIG. 4 is a graph illustrating quantum efficiency data for a solar cell of the type shown in FIG. 1.

FIG. 4 illustrates absolute external quantum efficiency data for an actual solar cell of the type shown in FIG. 1. The solar cell referred to in FIG. 4 did not include an antireflection coating. The solar cell exhibits very high overall quantum efficiency.

Figure 5:
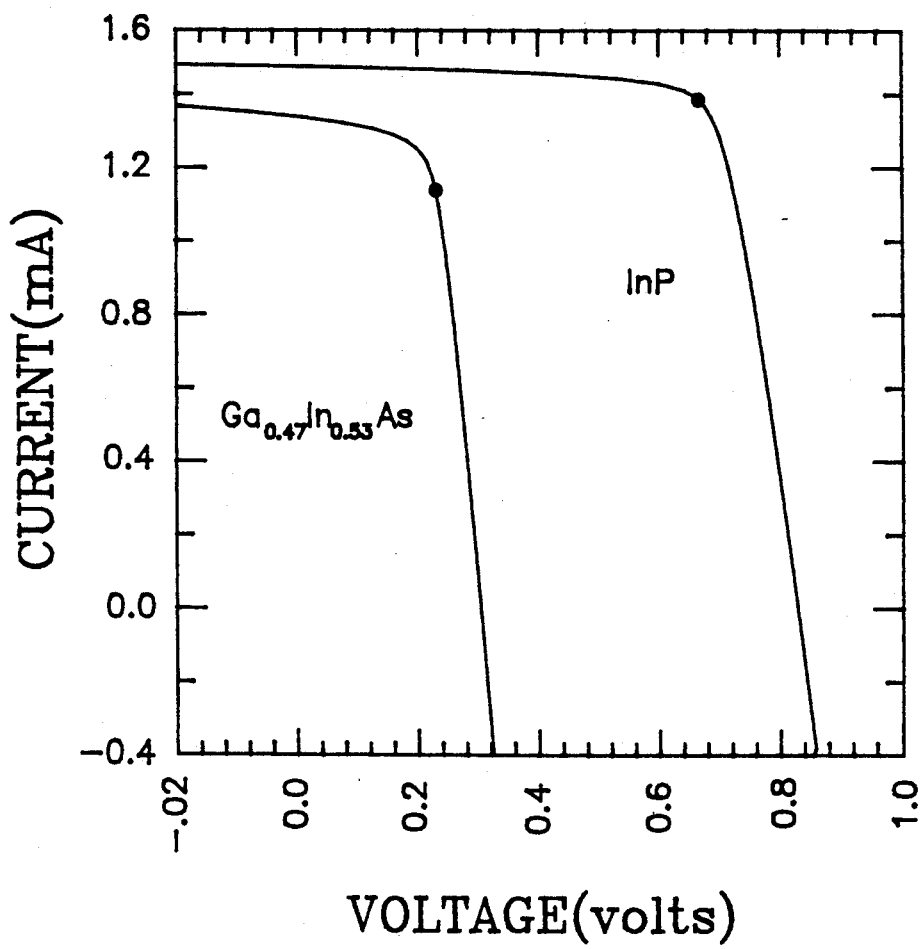
FIG. 5 is a graph illustrating current-voltage data for a solar cell of the type shown in FIG. 1.

FIG. 5 illustrates illuminated current-voltage data under a standard global spectrum for an actual solar cell of the type shown in FIG. 1, except that the solar cell does not include an antireflection coating. The solar cell would exhibit even better results with an antireflection coating present.

The three terminal configuration (e.g., as shown in FIG. 1) is advantageous because it allows for independent power collection from each subcell in the monolithic stack.

This minimizes the adverse impact of radiation damages on the overall tandem efficiency.

Realistic computer modeling calculations predict an efficiency boost of 7-11% from the $Ga_{0.47}In_{0.53}As$ bottom cell under AM0 illumination (25° C.) for concentration ratios in the 1-1000 range. Thus, practical AM0 efficiencies of 25-32% are believed possible with the InP/$Ga_{0.47}In_{0.53}As$ tandem cell.

Figure 2:
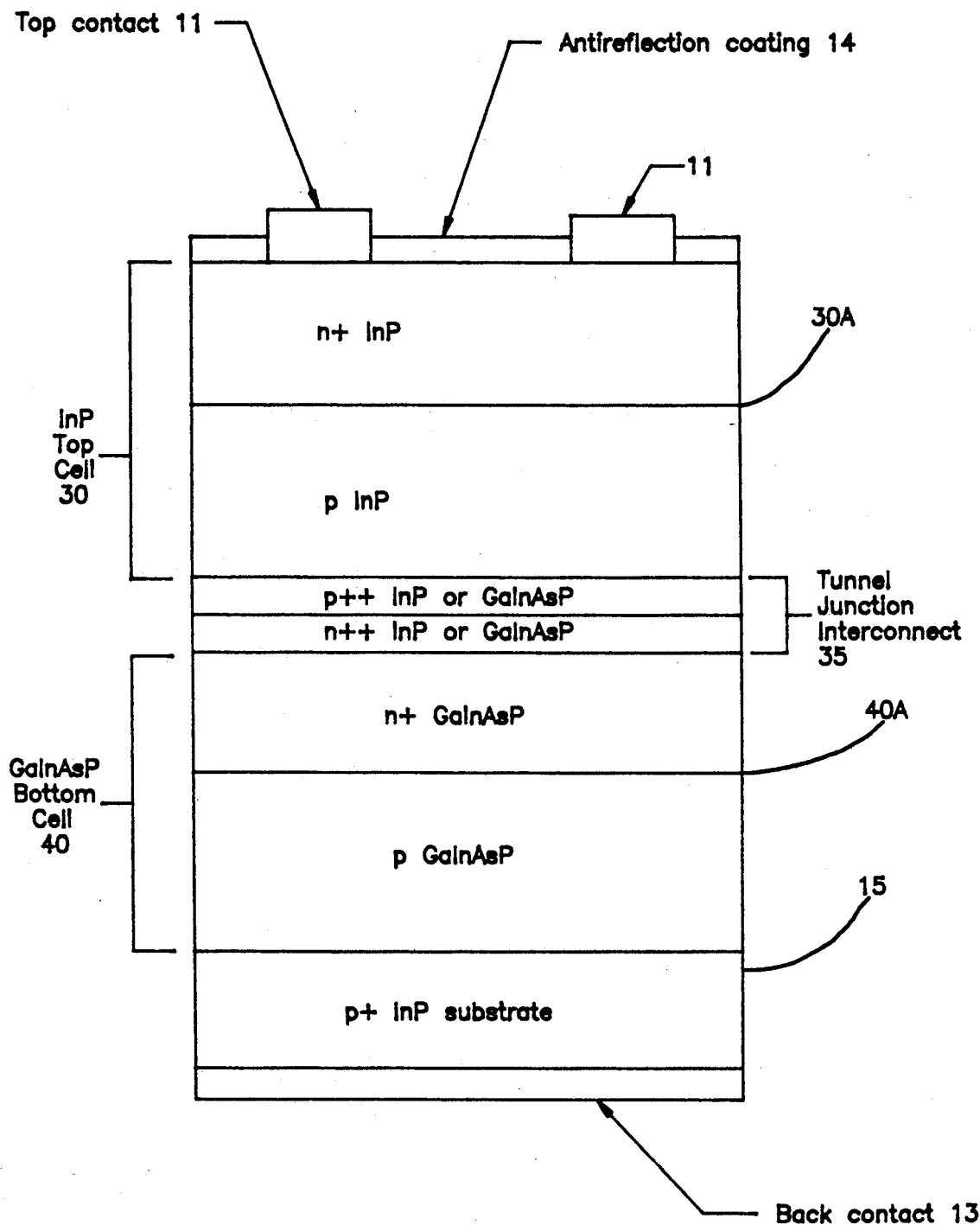
FIG. 2 is a side elevational view in schematic of another embodiment of monolithic tandem photovoltaic solar cell of the invention.

FIG. 2 illustrates another embodiment of solar cell of the invention which is a single-crystal, monolithic, two-junction, two terminal tandem solar cell. This cell includes an InP upper or top subcell 30 which includes a homojunction 30A. The lower or bottom subcell 40 includes homojunction 40A. Under the lower subcell there is an InP substrate 15, as described above.

Top conductive contacts 11 are supported by, and in electrical contact with, the upper surface of the upper subcell 30, as illustrated. Back conductive contact 13 is in electrical contact with the lower surface of the InP substrate. A conventional antireflection coating 14 is supported on the upper surface of the upper subcell.

The lower subcell 40 has the same composition as described above in connection with the solar cell of FIG. 1, except that it is provided as an n/p type instead of a p/n type.

Between the upper subcell 30 and the lower subcell 40 there is a tunnel junction interconnect 35. This junction connects the upper and lower subcells in series.

In one specific embodiment of the solar cell illustrated in FIG. 2, the solar cell can be optimized by adjusting the thickness of the InP upper subcell so as to match the current densities of the two subcells. For example, for subcells in bulk form (i.e., thick enough to absorb all photons with energy above their respective bandgaps) under the AM0 spectrum using $Ga_{0.47}In_{0.53}As$ as the bottom subcell, the bottom subcell is current-limiting. Therefore, it is required that the thickness of the InP top subcell must be reduced to an appropriate value such that the current densities of the subcells are matched.

Figure 3:
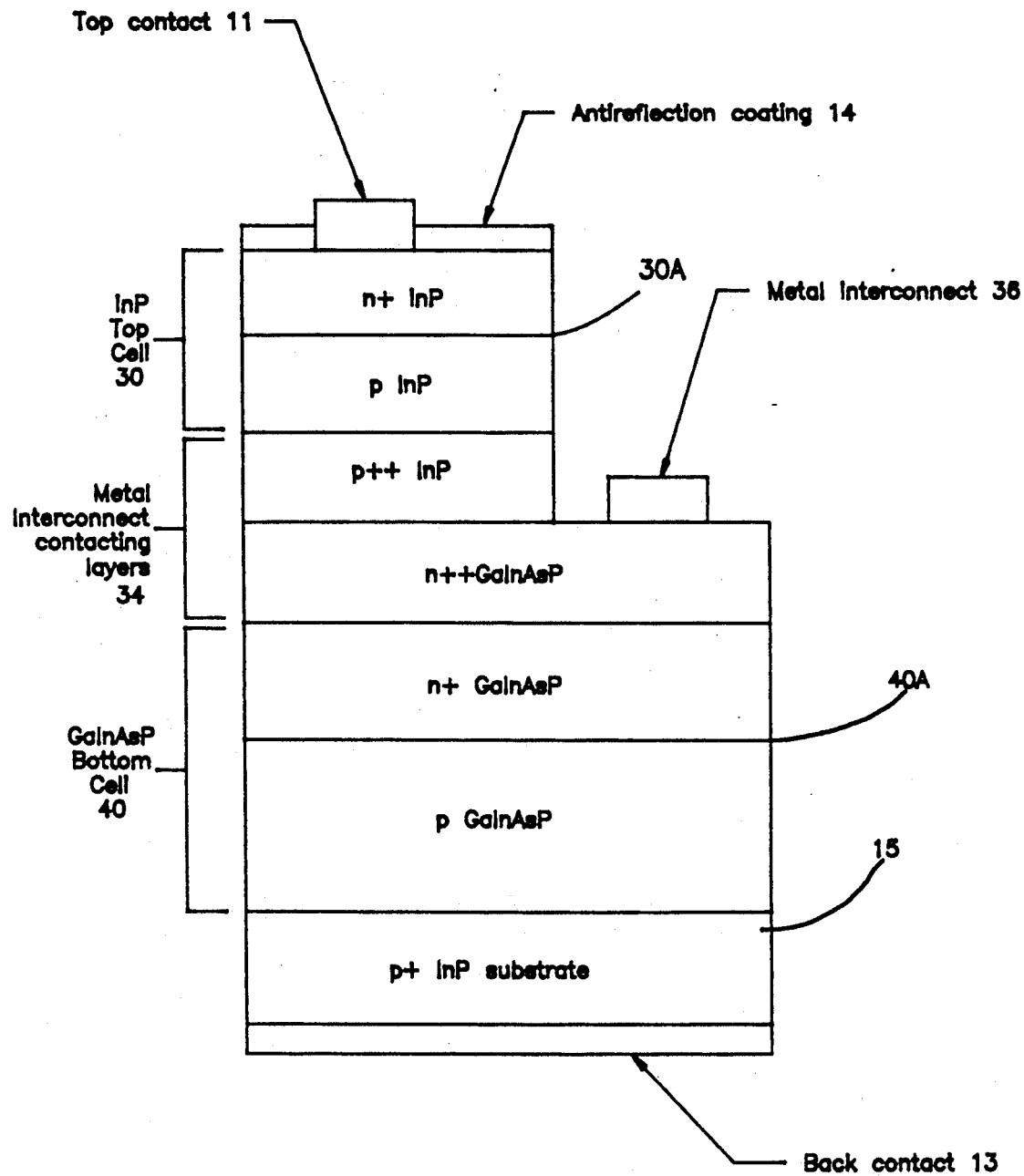
FIG. 3 is a side elevational view in schematic of yet another embodiment of monolithic tandem photovoltaic solar cell of the invention.

FIG. 3 illustrates another embodiment of a single-crystal, monolithic, two-junction, two terminal tandem solar cell of the invention. This cell includes an InP upper subcell 30 which includes a homojunction 30A. It also includes lower subcell 40 which includes homojunction 40A.

In the embodiment of FIG. 3, the upper subcell 30 is connected to the lower subcell 40, in series, by means of metal interconnect 36. The contacting layers of the two cells are denoted as 34. This is functionally equivalent to the tunnel junction, although the metal interconnect does make processing procedures more complex.

The foregoing is considered as illustrative only of the principles of the invention. Further, since numerous modifications and changes will readily occur to those skilled in the art, it is not desired to limit the invention to the exact construction and operation shown and described, and accordingly all suitable modifications and equivalents may be resorted to falling within the scope of the invention as defined by the claims which follow.

The embodiments of the invention in which an exclusive property or privilege is claimed are defined as follows:

1. A single-crystal, monolithic, tandem, photovoltaic solar cell, comprising:
  (a) an InP substrate having upper and lower surfaces;
  (b) a first photoactive subcell on said upper surface of said substrate; said first subcell comprising $Ga_{0.-}$ $Ga_{0.47}In_{0.53}As$; said first subcell including a homojunction; and (c) a second photoactive subcell on said first photoactive subcell; wherein said second subcell comprises InP; said second subcell including a homojunction; wherein said GaInAs is lattic-matched with said InP; and wherein said second subcell has a larger energy bandgap than said first subcell.

2. A photovoltaic solar cell in accordance with claim 1, wherein said first and second subcells each include an n/p homojunction.

3. A photovoltaic solar cell in accordance with claim 2, wherein said solar cell includes two output terminals, and wherein said subcells are connected in series.

4. A photovoltaic solar cell in accordance with claim 3, wherein said subcells are interconnected by means of a tunnel junction.

5. A photovoltaic solar cell in accordance with claim 3, wherein said subcells are electrically connected by means of a metal interconnect.

6. A photovoltaic solar cell in accordance with claim 1, wherein one of said subcells includes an n/p homojunction and the other said subcell includes a p/n homojunction; and wherein said solar cell includes three output terminals.

7. A single-crystal, monolithic, tandem, photovoltaic solar cell, comprising:

(a) an InP substrate having upper and lower surfaces;

(b) a first photoactive subcell on said upper surface of said substrate; said first subcell comprising GaInAs and including a homojunction; wherein said GaInAs is of the composition $Ga_{0.47}In_{0.53}As$; and (c) a second photoactive subcell on said first subcell wherein said second subcell comprises InP and includes a homojunction;

wherein said GaInAs is lattice-matched with said InP; and wherein said second subcell has a larger energy bandgap than said first subcell.

8. A photovoltaic solar cell in accordance with claim 7, wherein said second subcell includes an upper surface; wherein each said subcell includes a photoactive region; and wherein said second subcell includes a lower region below its said photoactive region; wherein said lower region of said second subcell and the adjacent upper region of said first subcell are of common conductivity type; said solar cell further comprising:

(a) a conductive layer providing low resistance ohmic contact to said lower surface of said InP substrate;

(b) a conductive top contact providing low resistance ohmic contact with said upper surface of said second subcell; and (c) a conductive middle contact providing low resistance ohmic contact with said lower region of said second subcell.

9. A method for preparing a single crystal, monolithic, tandem, photovoltaic solar cell, comprising the steps of:

(a) providing an InP substrate having an upper surface;

(b) epitaxially depositing on said upper surface of layer of GaInAs to form a first photoactive subcell; wherein said GaInAs is deposited in a manner such that a homojunction is provided in said layer; wherein said GaInAs is of the composition $Ga_{0.47}In_{0.53}As$;

(c) epitaxially depositing a layer of InP on said GaInAs layer to form a second photoactive subcell; wherein said InP is deposited in a manner such that a homojunction is provided in said InP layer; wherein said GaInAs is lattice-matched with said InP substrate and said InP layer.

10. A method in accordance with claim 9, wherein each said homojunction is an n/p type.

11. A method in accordance with claim 10, wherein said solar cell includes two output terminals, and wherein said subcells are connected in series.

12. A method in accordance with claim 9, wherein one of said subcells includes an n/p homojunction and the other of said subcells includes a p/n homojunction; wherein said solar cell includes three output terminals.

* * * * *